(12) United States Patent
Oh

(10) Patent No.: US 7,825,456 B2
(45) Date of Patent: Nov. 2, 2010

(54) SEMICONDUCTOR MEMORY DEVICE WITH REDUCED POWER CONSUMPTION

(75) Inventor: Yong-Ho Oh, Bupyeong-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 49 days.

(21) Appl. No.: 12/166,359

(22) Filed: Jul. 2, 2008

(65) Prior Publication Data

US 2009/0026573 A1 Jan. 29, 2009

(30) Foreign Application Priority Data

Jul. 24, 2007 (KR) .................. 10-2007-0073786

(51) Int. Cl.
*H01L 27/108* (2006.01)

(52) U.S. Cl. ............... 257/316; 257/261; 257/296; 257/E21.018; 257/E21.21

(58) Field of Classification Search ......... 257/314–316, 257/E21.21, 261, 296, E21.018
See application file for complete search history.

(56) References Cited

U.S. PATENT DOCUMENTS

| | | | | |
|---|---|---|---|---|
| 6,525,403 | B2 * | 2/2003 | Inaba et al. | 257/618 |
| 6,649,959 | B2 * | 11/2003 | Hsu et al. | 257/296 |
| 7,511,358 | B2 * | 3/2009 | Choi et al. | 257/618 |
| 2003/0080356 | A1 * | 5/2003 | Miida | 257/200 |
| 2003/0209767 | A1 * | 11/2003 | Takahashi et al. | 257/390 |

FOREIGN PATENT DOCUMENTS

JP 15-078048 3/2003

* cited by examiner

*Primary Examiner*—Wael M Fahmy
*Assistant Examiner*—John C Ingham
(74) *Attorney, Agent, or Firm*—Sherr & Vaughn, PLLC

(57) ABSTRACT

A nonvolatile semiconductor memory device and a method for manufacturing the same that may include forming an isolation pattern in a substrate, and then etching a portion of the isolation pattern to expose a portion of an active region of the substrate, and then forming high-density second-type ion implantation regions spaced apart at both edges of the active region by performing a tilted ion implantation process, and then forming a high-density first-type ion implantation region as a bit line in the active region, and then forming an insulating layer on the substrate including the high-density first-type ion implantation region, the high-density second-type ion implantation regions and the isolation pattern, and then forming a metal interconnection as a word line on the insulating layer pattern and extending in a direction perpendicular to bit line.

10 Claims, 7 Drawing Sheets

SEMICONDUCTOR MEMORY DEVICE WITH REDUCED POWER CONSUMPTION

Figure 1:
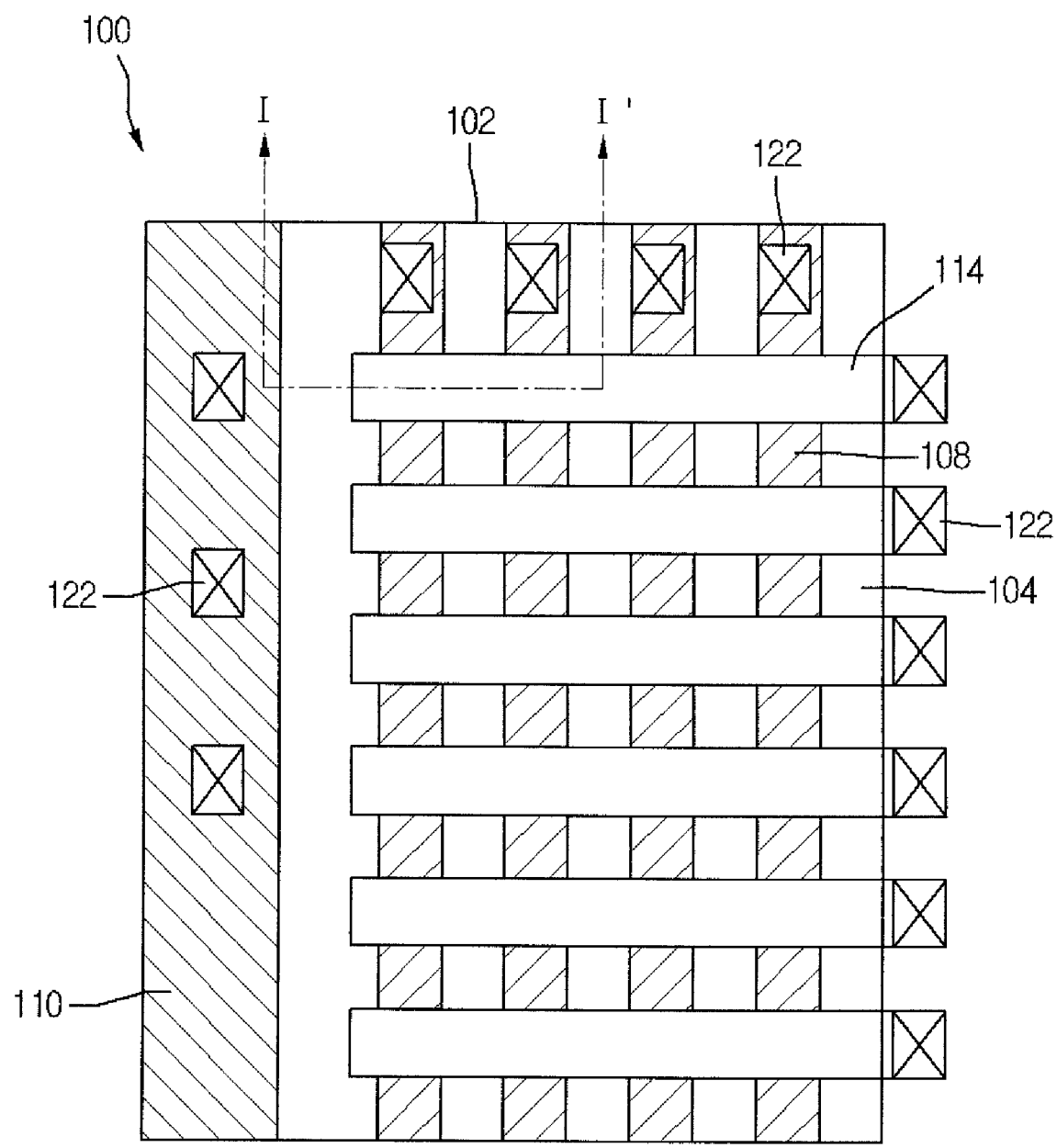

The present application claims priority under 35 U.S.C. §119 and 35 U.S.C. §365 to Korean Patent Application No. 10-2007-0073786 (filed on Jul. 24, 2007), which is hereby incorporated by reference in its entirety.

BACKGROUND

Semiconductor memory devices may be classified into and read only memory (ROM) products and RAM products, such as a dynamic random access memory (DRAM) and static random access memory (SRAM). RAM products may have relatively fast data input/output performance while being volatile to lose data according to the passage of time. ROM products may have relatively slow data input/output performance while being nonvolatile to retain data if the data is input. ROM products can be classified into a ROM, a programmable ROM (PROM), an erasable PROM (EPROM), and an electrically EPROM (EEPROM). Among the ROM products, the demand for the EEPROM that is electrically programmable or erasable has been increased. The EEPROM or a flash EEPROM equipped with a simultaneous erase function may have a stack structure of a floating gate and a control gate. Such a flash memory cell has been extensively used for a printer, a computer BIOS, and portable electronics such as a notebook personal computers, PDAs and cellular phones. In such nonvolatile semiconductor memory devices, various structures have been suggested in order to overcome problems caused by a short channel effect as a channel length is shortened.

SUMMARY

Embodiments relate to a nonvolatile semiconductor memory device having a structure capable of reducing power consumption when programming or erasing the memory device through FN tunneling or band-to-band tunneling.

Embodiments relate to a nonvolatile semiconductor memory device and a method of manufacturing the same, in which the nonvolatile semiconductor memory device has a PN diode structure obtained through a tilted ion implantation process, dopants are heavily doped into a local area of the nonvolatile semiconductor memory device through the tilted ion implantation process to improve programming performance and a programming speed, and power consumption can be greatly reduced as compared with other nonvolatile semiconductor memory devices.

Embodiments relate to a semiconductor memory device may include at least one of the following: isolation patterns formed in a silicon substrate; a high-density first-type ion implantation region formed in the silicon substrate between the isolation patterns; high-density second ion implantation ions formed below the high-density first-type ion implantation region corresponding to both sides of the high-density first-type ion implantation region; an insulating layer pattern on and/or over the high-density first-type ion implantation region; and an interconnection formed on and/or over the insulating layer pattern while crossing the high-density ion implantation region.

Embodiments relate to a method for manufacturing a semiconductor memory device that may include at least one of the following steps: forming isolation patterns in an upper portion of a silicon substrate, the isolation pattern isolating memory cells from each other; and then forming high-density second-type ion implantation regions by selectively performing a tilted ion implantation process with respect to a portion of the memory cell provided between the isolation patterns; and then forming a high-density first-type ion implantation region in the memory cell formed with the second high-density second-type ion implantation region; and then forming an insulating layer pattern on and/or over the high-density first and second ion implantation regions; and then forming an interconnection on the insulating layer pattern while crossing the high-density first-type ion implantation region.

Embodiments relate to a method for manufacturing a semiconductor memory device that may include at least one of the following steps: forming a trench in a substrate; and then forming an isolation layer material on the substrate and filling the trench; and then polishing the isolation layer material to form an isolation pattern in the trench; and then etching a portion of the isolation pattern to expose a portion of a side surface of an active region of the substrate such that an uppermost surface of the etched isolation pattern is spatially below the uppermost surface of the active region; and then forming high-density second-type ion implantation regions spaced apart at both edges of the active region by performing a tilted ion implantation process; and then forming a high-density first-type ion implantation region as a bit line in the active region; and then forming an insulating layer on the substrate including the high-density first-type ion implantation region, the high-density second-type ion implantation regions and the isolation pattern; and then forming a metal interconnection as a word line on the insulating layer pattern and extending in a direction perpendicular to bit line.

In the semiconductor memory device in accordance with embodiments, FN tunneling and band-to-band tunnel may be used, thereby reducing power consumption when programming and erasing a nonvolatile memory device.

The nonvolatile semiconductor device in accordance with embodiments may be locally doped through a tilted ion implantation process using heavy ions so that programming performance and a programming speed are may be increased.

The nonvolatile semiconductor memory device in accordance with embodiments may use a PN diode which locally has a high doping density through a tilted ion implantation process, so that several problems occurring in other transistor nonvolatile semiconductor devices (e.g., NOR, NAND flash memory device, and SONOS) can be overcome.

In accordance with embodiments, it is possible to overcome the increase of current leakage, high power consumption in programming and reading operations, and the interference between adjacent memory cells caused by a punch through phenomenon occurring, as the size of the transistor nonvolatile memory semiconductor device is reduced.

DRAWINGS

Figure 2:
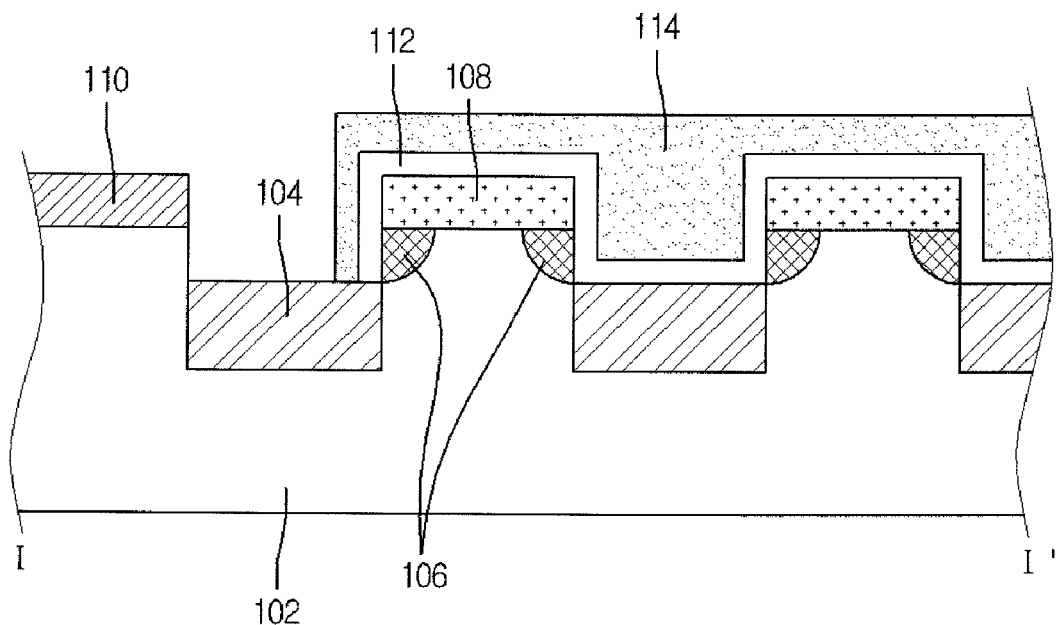

Example FIGS. 1 and 2 illustrate a portion of a cell array of a volatile semiconductor memory cell array in accordance with embodiments.

Example FIGS. 3 to 8 illustrate a method for manufacturing a nonvolatile semiconductor memory device in accordance with embodiments.

Figure 9:
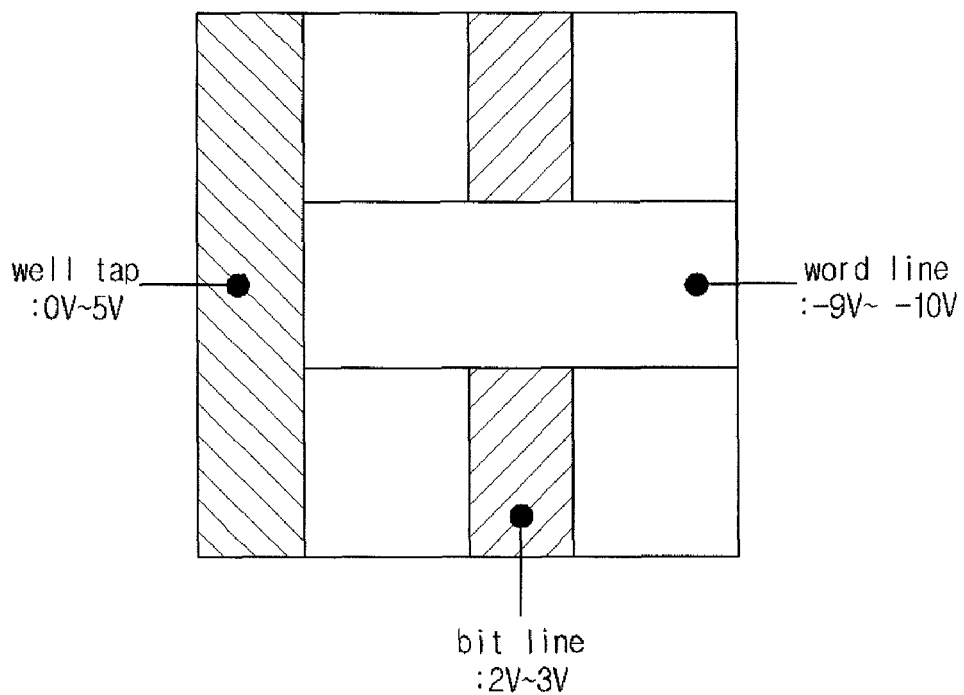
Figure 10:
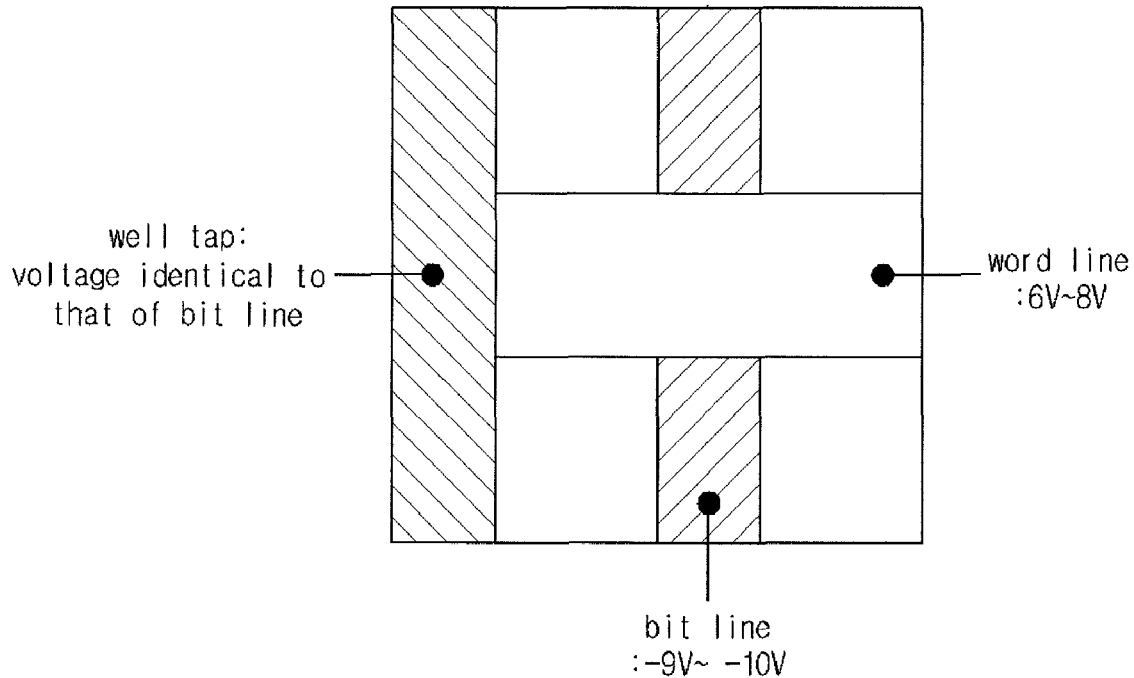
Figure 11:
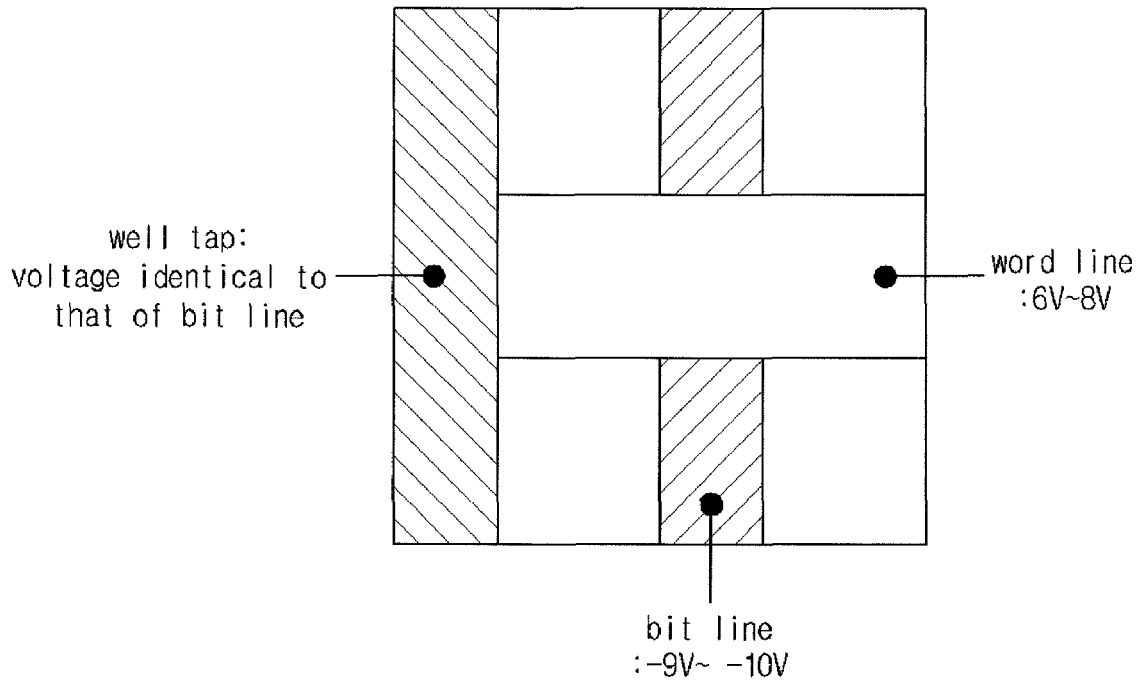

Example FIGS. 9 to 11 illustrate the operation of a memory cell in accordance with embodiments.

Figure 12:
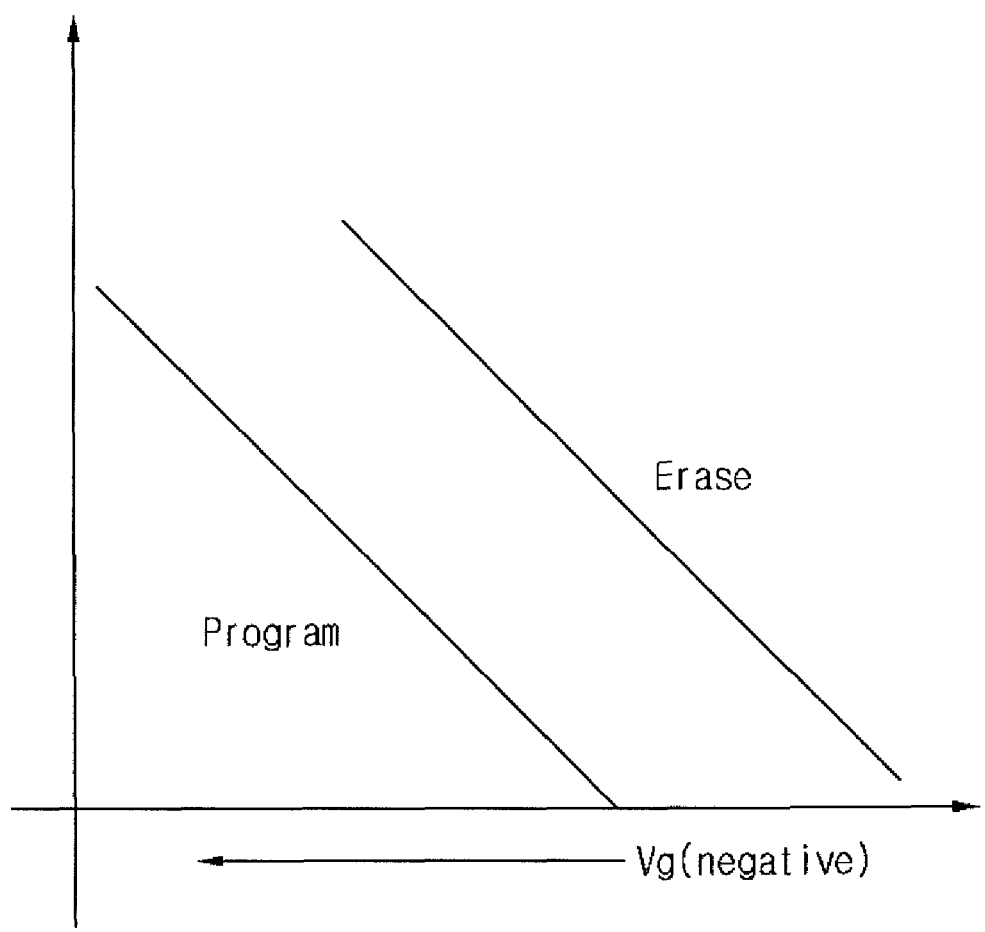

Example FIG. 12 illustrates a graph of a band-to-band current of a memory cell in accordance with embodiments.

DESCRIPTION

The terms "first" and "second" descried below are used to distinguish members from each other and to represent at least two members, not to define the members. Accordingly, if the terms "first" and "second" are mentioned, plural members are provided, and the members can be selectively or alternatively used. The size (dimension) of elements shown in the drawings can be magnified for the purpose of clear explanation and the real size of the elements may be different from the size of elements shown in drawings. In addition, the present invention may not include all the elements shown in the drawings and may not be limited thereto. The elements except for essential elements of the present invention can be omitted or added without limitation. In the description of an embodiment, it will be understood that when a layer (or film) is referred to as being 'on/above/over/upper' another layer or substrate, it can be directly on another layer or substrate, or intervening layers may also be present. Further, it will be understood that when a layer is referred to as being 'down/below/under/lower' another layer, it can be directly under another layer, and one or more intervening layers may also be present. In addition, it will also be understood that when a layer is referred to as being 'between' two layers, it can be the only layer between the two layers, or one or more intervening layers may also be present. Thus, the meaning thereof must be determined based on the scope of the embodiment. In the following description of the present invention, a detailed description of known functions and configurations incorporated herein will be omitted when it may make the subject matter of the present invention rather unclear.

As illustrated in example FIGS. 1 and 2, a volatile semiconductor memory device in accordance with embodiments may include semiconductor substrate 102 having well tap region 110 formed thereon and/or thereover to supply well bias, bit lines, word lines 114 and isolation patterns 104. The bit line may include first-type ion implantation region 108 formed on and/or over silicon substrate 102. For example, isolation patterns 104 may include a shallow trench isolation pattern formed in substrate 102. A memory cell may be formed between isolation patterns 104. High-density first-type ion implantation region 108 crosses word line 114. Well tap region 110 may be formed in the vicinity or adjacent to of cell array 100. High-density first-type ion implantation region 108 serving as the bit line, word line 114 and well tap region 110 may be formed therein with contacts 122. A bit voltage, a word voltage and a well bias voltage may be supplied to the bit line, word line 114 and well tap region 110, respectively, through corresponding contacts 122.

A memory cell may be formed in an active region on and/or over semiconductor substrate 102 defined by isolation patterns 104. Isolation pattern 104 may be partially buried in a trench so that sidewalls of the trench can be partially exposed. In other words, side surfaces of the active region can be exposed as well as a top surface of the active region. High-density first-type ions may be implanted into an upper portion of the active region, thereby forming first high-density first-type ion implantation region 108. First-type ions may include N-type ions, such as at least one of arsenic (As), phosphorus (P) and antimony (Sb). First high-density first-type ion implantation region 108 may be the bit line. High-density second-type ion implantation regions 106 may be formed under high-density first-type ion implantation regions 108 and formed by implanting high-density second-type ions along both edges of the active region. High-density second-type ion implantation regions 106, which are formed at both edges of the active region, may be separated from each other, or may not be separated from each other. The second-type ions may include P-type ions such as at least one of boron (B), boron difluoride ($BF_2$), and indium (In). Since the diffusion of dopants implanted through the following thermal process must be restricted as much as possible in order to form a PN diode having a heavily doped local area, a relatively heavier element may be selected as the second-type ion from among the above elements.

Semiconductor substrate 102 may have at the lower portions of high-density first and second-type ion implantation regions 108 and 106 with a second-type well. The second-type well may receive a well bias voltage from well tap region 110 formed by implanting the high-density second-type ions in semiconductor substrate 102. The second-type ion may include a P-type ion such as at least one of boron (B), boron difluoride (BF2), and indium (In). Insulating layer pattern 112 may be formed between word line 114 and semiconductor substrate 102. Insulating layer pattern 112 may include an ONO layer. For example, the ONO layer may include a lower oxide layer formed on and/or over semiconductor substrate 102, a nitride layer formed on and/or over the lower oxide layer as a charge trap layer, and an upper oxide layer formed on and/or over the nitride layer. The nitride layer is a region in which hot holes are trapped. The ONO layer is formed thereon with word line 114. Word line 114 may include at least one of doped polysilicon, tantalum nitride (TaN), titanium nitride (TiN), tungsten (W) and tantalum (Ta). The first-type ion may include a P-type ion, and the second-type ion includes an N-type ion.

FIGS. 3 to 7 are sectional views showing the method for manufacturing the nonvolatile semiconductor memory device according to the embodiment.

Figure 3:
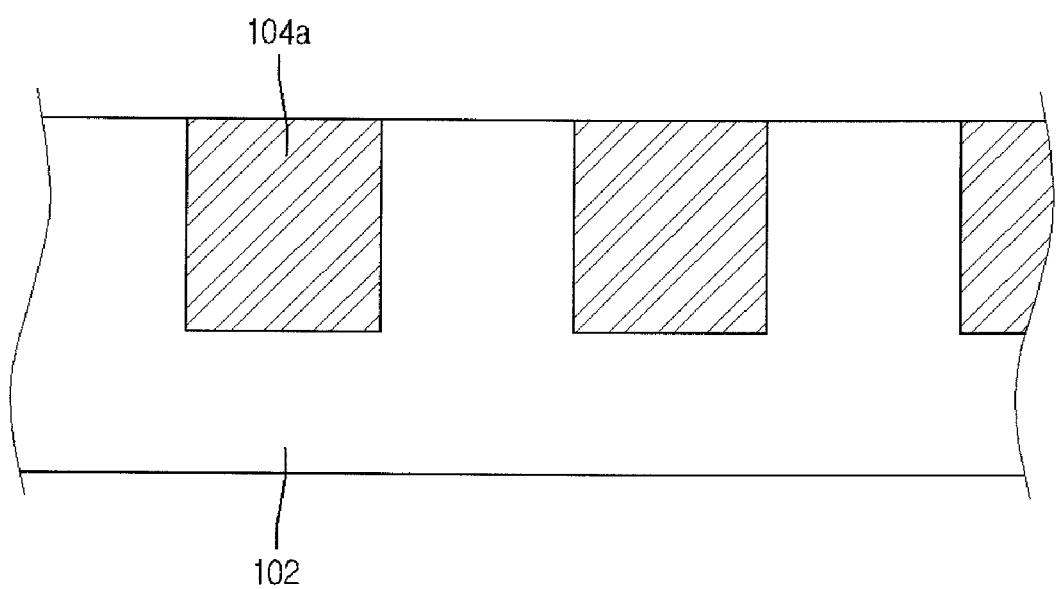

As illustrated in example FIG. 3, preliminary isolation patterns 104a may be formed in semiconductor substrate 102. For example, preliminary isolation pattern 104a may include a shallow trench isolation pattern formed through a shallow trench isolation (STI) process. Preliminary isolation patterns 104a may be formed spaced apart a predetermined interval to isolate memory cells from each other. In detail, after forming a trench by etching semiconductor substrate 102 by a predetermined thickness, an oxide layer serving as an isolation material, may then be sufficiently formed on and/or over the entire surface of semiconductor substrate 102 such that the trench can be filled with the oxide layer. The oxide layer may then be polished through chemical mechanical polish (CMP) to form preliminary isolation pattern 104a only in the trench. A memory cell structure may be formed in an active region of semiconductor substrate 102 having no the preliminary isolation pattern 104a. Low-density second-type ions may then be implanted into semiconductor substrate 102 formed with preliminary isolation pattern 104a such that a second-type well can be formed. In addition, after implanting low-density second-type ions into semiconductor substrate 102, isolation pattern 104 may be formed in semiconductor substrate 102.

Figure 4:
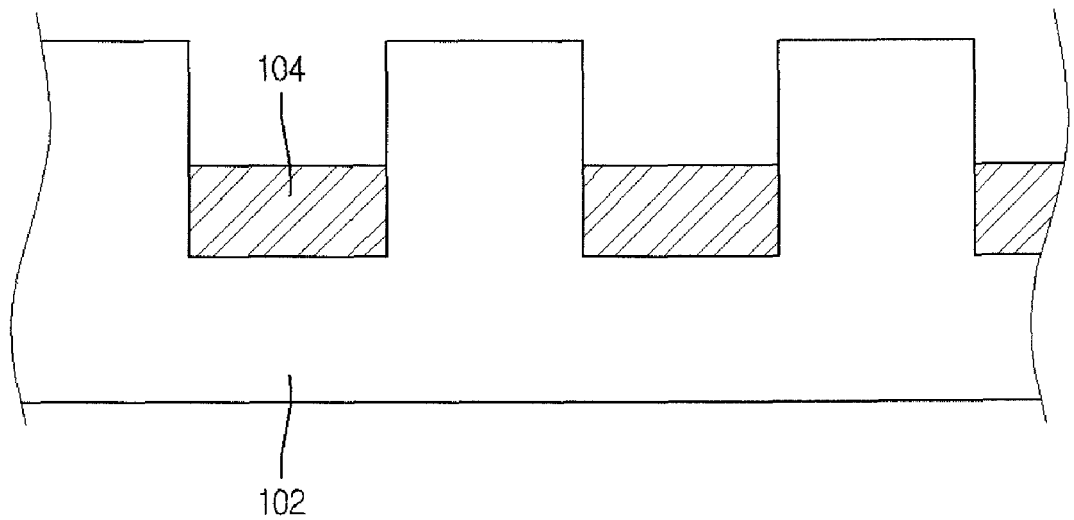

As illustrated in example FIG. 4, a portion of preliminary isolation pattern 104a may then be removed thereby forming isolation pattern 104. A portion of isolation pattern 104 may then be removed, thereby exposing a portion of a side surface of the active region between isolation patterns 104. In other words, the edges of the active region may be exposed. An uppermost surface of isolation pattern 104 may be placed under the uppermost surface of the active region. The oxide layer of isolation pattern 104 may be etched through wet etch or reactive ion etch (RIE).

Figure 5:
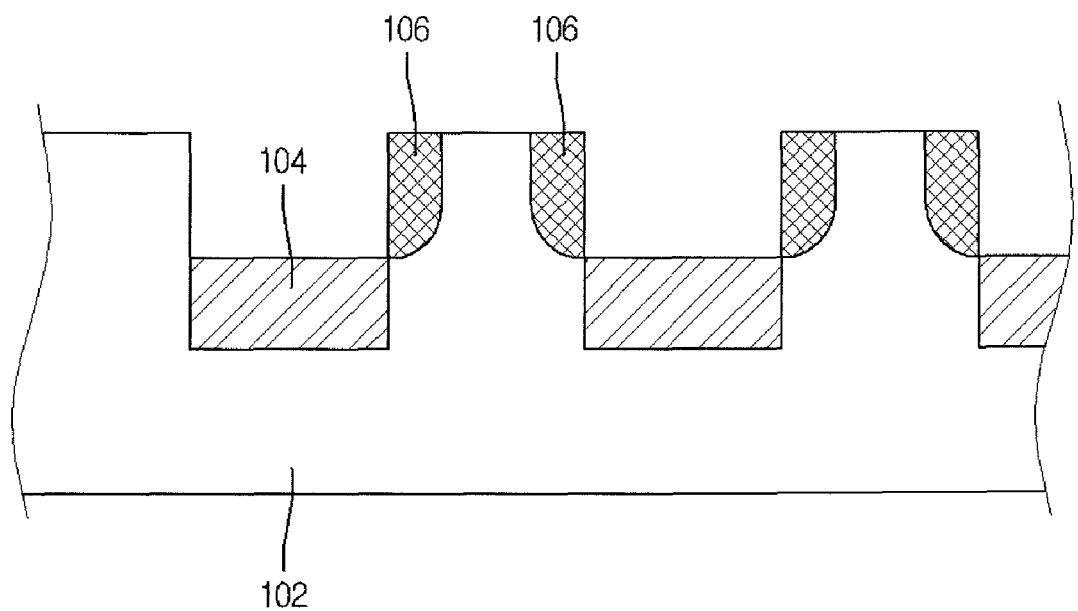

As illustrated in example FIG. 5, in order to form a PN diode structure on and/or over semiconductor substrate 102, second-type ions may be selectively implanted through the tilted ion implantation so that high-density second-type ion implantation regions 106 are formed at both edges of the active region of semiconductor substrate 102. The tilted ion implantation may be performed at an inclination angle in the range of between about 0 to 90° about semiconductor substrate 102. High-density second-type ion implantation region 106 formed at the first edge of the active region may be separated from or connected to the high-density second-type implantation region 106 formed at the second edge of the active region. High-density second-type ion implantation regions 106 may be formed with a predetermined depth at a portion of the uppermost surface and a portion of the side surface of the semiconductor substrate. The second-type ion may include a P-type ion such as at least one of boron (B), boron difluoride ($BF_2$) and indium (In). A heavier ion may be selected as the second-type ion among the above ions. For example, indium (In) ions may be implanted through tilted ion implantation with energy in a range between 40 keV to 80 keV, a dosage amount in a range between 1.0E15 to 3.0E15 and a tilted ion implantation angle in a range between 0° to 45°.

Figure 6:
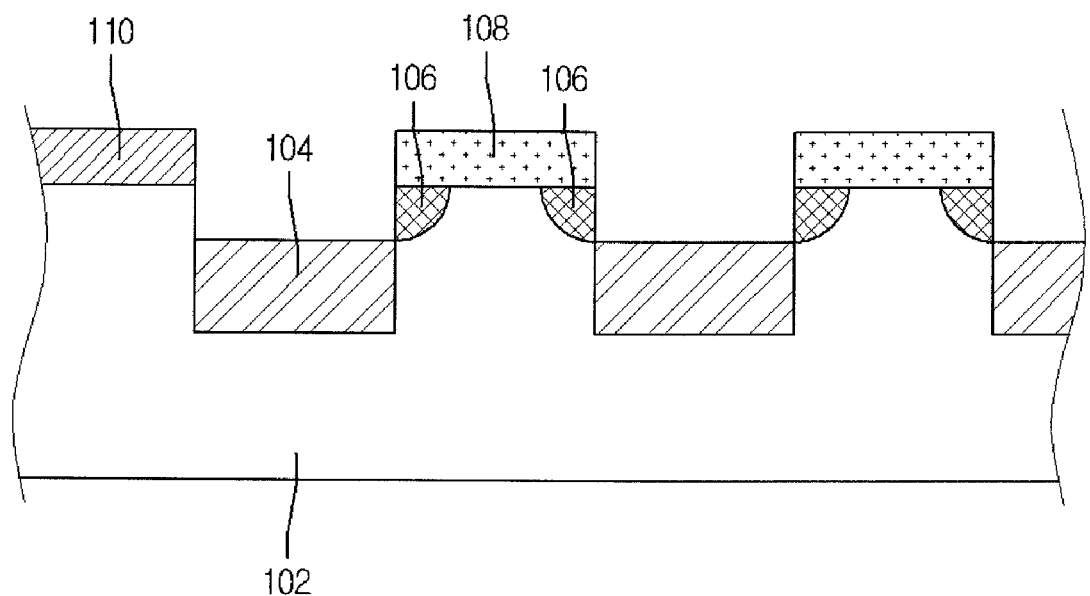

As illustrated in example FIG. 6, high-density first-type ion implantation region 108 may then be formed in the active region of semiconductor substrate 102. High-density first-type ion implantation region 108 may serve as a bit line. The first-type ion may be an N-type ion such as at least one of arsenic (As), phosphorus (P) and antimony (Sb). The first-type ion may be a P-type ion, and the second-type ion may be an N-type ion. When antimony (Sb) ions are implanted through the tilted ion implantation, high-density second-type ion implantation region may have energy in a range between 30 keV to 70 keV, a dosage amount in a range between 1.0E15 to 3.0E15 and a tilted ion implantation angle in a range between 0° to 45°. Well tap region 110 may then be formed to apply a bias voltage to the second-type well. Well tap region 110 may be formed by implanting the high-density second-type ion. The junction area of high-density first-type ion implantation region 108, high-density second-type ion implantation region 106 and the ONO layer, which is formed later, is expanded so that operational efficiency may be improved when programming, erasing, or reading the memory cell.

Figure 7:
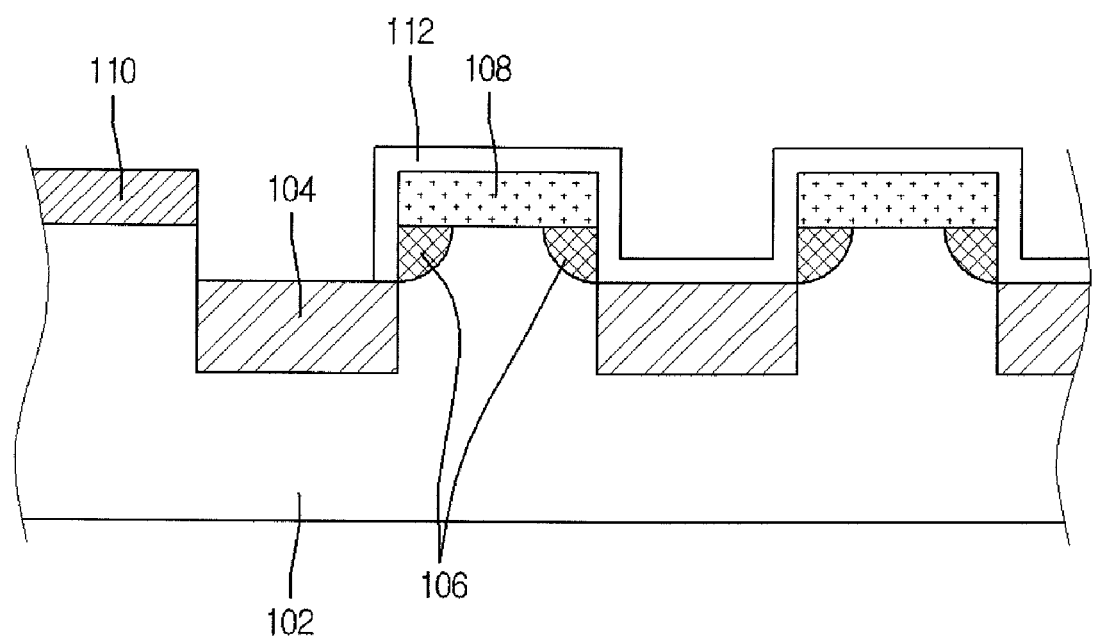

As illustrated in example FIG. 7, insulating layer pattern 112 may then be formed on and/or over the active region formed with high-density first-type and second-type ion implantation regions 108 and 106. For example, insulating layer pattern 112 may be an ONO layer that may include a lower oxide layer as a tunnel oxide layer, a nitride layer as a charge trap layer formed on and/or over the lower oxide layer, and an upper oxide layer formed on and/or over the nitride layer. The lower oxide layer may be formed through a thermal oxidation process, and may have the thickness in the range of between 1 nm to 3 nm. The nitride layer may be formed through a low pressure chemical vapor deposition (LPCVD) scheme in which a thin film is deposited through simple chemical reaction using thermal energy in a low-temperature reaction vessel. The nitride layer may have a thickness in the range of between 2 mm to 7 mm. The upper oxide layer may be formed through a thermal oxidation scheme or an LPCVD scheme. The oxide layer may have a thickness in the range of between 2 nm to 7 nm. Insulating layer pattern 112 may be formed to directly contact high-density first-type ion implantation region 108 and high-density second-type ion implantation region 106.

Figure 8:
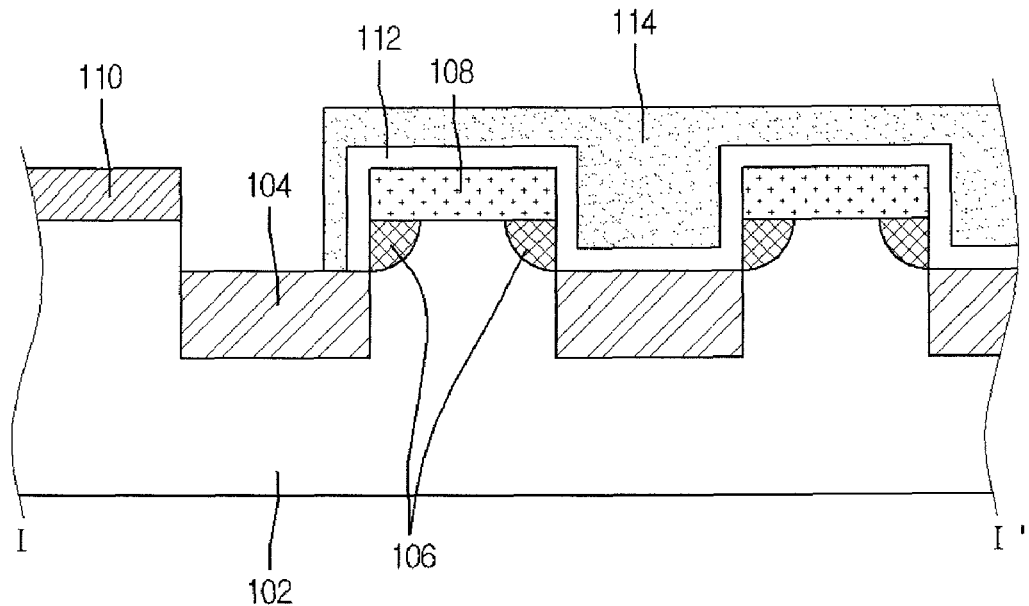

As illustrated in example FIG. 8, word line 114 may then be formed on and/or over insulating layer pattern 112 of semiconductor substrate 102. Word line 114 may include at least one selected from the group consisting of doped polysilicon, tantalum nitride (TaN), titanium nitride (TiN), tungsten (W) and tantalum (Ta). Word line 114 and insulating layer pattern 112 may be formed through the various combination thereof. For example, after forming a word line layer on and/or over the entire surface of semiconductor substrate 102 formed with an insulating layer, the word line layer and the insulating layer may then be patterned to form word line 114 and insulating layer pattern 112. Word line 114 may cross (i.e., bisect) high-density first-type ion implantation region 108 serving as a bit line.

As illustrated in example FIG. 9, a voltage application state when programming the memory cell, meaning, a voltage application state to the second-type well, the bit line (i.e., high-density first-type ion implantation region 108), and word line 114 is provided. When programming the memory cell, a voltage in the range between 0V to −5V may be applied to the second-type well, a voltage in the range of 2V to 3V may be applied to the bit line (i.e., high-density first-type ion implantation region 108) and a voltage in the range between −9V to −10V may be applied to word line 114. The voltages applied to the second-type well, the bit line, and the word line are for illustrative purposes only, and embodiments are not limited thereto. If a predetermined voltage is applied to the above components such that charges can be trapped in an ONO layer of the memory cell to perform programming, the voltage may be called a program voltage. Band-to-band tunneling refers to a phenomenon in which electrons tunnel from a valence band to a conduction band through a forbidden energy gap. In addition, the bending of a local band in a region subject to a high electric field increases a tunneling probability. If the voltage is applied as shown in example FIG. 9, hot holes are generated from a PN junction part between the high-density first-type ion implantation region and the high-density second-type ion implantation region because band-to-band tunneling is created due an electric field resulting from a strong word line voltage and a high-density PN junction layer. The hot holes are trapped in the nitride layer of the ONO layer so that the hot holes are stacked on the nitride layer of the ONO layer while performing programming.

As illustrated in example FIG. 10, provided is an erase operation for the memory cell in accordance with embodiments, meaning, a voltage application state to the second-type well, the bit line, and the word line. When erasing the memory cell, the same voltage may be applied to the second-type well and the bit line. A voltage in the range of −9V to −10V may be applied to the bit line, and a voltage in the range of 6V to 8V may be applied to the word line. The FN tunneling refers to a phenomenon in which a tunneling current exponentially increases with respect to an electric filed when a high electric field is applied an oxide layer between electrodes. Due to the voltage application state shown in example FIG. 10, a strong electric field is applied to the lower oxide layer of the ONO layer, which is a tunnel insulating layer, so that tunneling occurs in a bit line direction from the nitride layer of the ONO layer, which is a charge trap layer, thereby performing the erase operation.

As illustrated in example FIG. 11, provided is a plan view showing the read operation for the memory cell in accordance with embodiments, meaning, a voltage application state to the second-type well, the bit line, and the word line. When reading the memory cell, a voltage of 0V, a voltage in the range between 2V to 3V and a voltage in the range between −5V to −8V may be applied to the second-type well, the bit line, and the word line, respectively. If the voltage is applied as shown in example FIG. 11, a current flows at a PN junction part between the high-density first-type ion implantation region and the high-density second-type ion implantation region because band-to-band tunneling is created due to an electric field resulting from a strong word line voltage and a high-density PN junction layer. The programmed memory cell and the erased memory cell have a difference in a current flowing through the bit lines due to the band-to-band tunneling. A sense amplifier detects the current difference between the bit lines, so that the memory outputs a value of "0" or "1" when reading the memory cell that finally is programmed or erased.

As illustrated in example FIG. 12, provided is a graph showing a band-to-band current of the memory cell in accordance with embodiments. As shown in example FIG. 12, when taking into consideration the difference between band-to-band currents of a programmed memory cell and an erased memory cell according to the voltages applied to the bit line and the word line in a read operation, a great amount of a band-to-band current flows as the voltage Vg of the word line is increased in a negative direction. In addition, under the same word line voltage Vg, the current of the programmed memory cell is less than that of the erased memory cell in the read operation. In the nonvolatile semiconductor memory device in accordance with embodiments employing a PN diode structure formed by the high-density first-type and second-type ion implantation regions, high-density second-type ions are selectively doped only in a region, which is filled with charges, through the tilted ion implantation. Accordingly, in programming, device efficiency may be raised, and power consumption can be reduced.

In the nonvolatile semiconductor memory device in accordance with embodiments, power consumption can be reduced through fowler nordheim tunneling (FN) and band-to-band tunneling when programming or erasing the nonvolatile semiconductor memory device. The nonvolatile semiconductor device in accordance with embodiments may be locally doped through a tilted ion implantation process using heavy ions, so that programming performance and speed are may be increased. The nonvolatile semiconductor memory device in accordance with embodiments may use a PN diode which locally has a high doping density through the tilted ion implantation process, so that several problems occurring in other transistor nonvolatile semiconductor devices (e.g., NOR, NAND flash memory device, and SONOS) can be overcome. In accordance with embodiments, it is possible to overcome the increase of current leakage, high power consumption in programming and reading operations, and the interference between adjacent memory cells caused by a punch through phenomenon occurring as the size of the transistor nonvolatile memory semiconductor device is reduced.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. An apparatus comprising:
    isolation patterns formed in a semiconductor substrate;
    a bit line comprising a high-density first-type ion implantation region formed in an upper portion of an active region of the semiconductor substrate between the isolation patterns;
    a well tap region comprising a first high-density second-type ion implantation region formed in an upper portion of the semiconductor substrate and spaced apart from the high-density first-type ion implantation region;
    second high-density second-type ion implantation regions formed below the high-density first-type ion implantation region and the first high-density second-type ion implantation region such that the uppermost surface thereof is below the uppermost surface of the high-density first-type ion implantation region and the first high-density second-type ion implantation region, respectively;
    an insulating layer pattern formed on and contacting the high-density first-type ion implantation region, the high-density second-type ion implantation regions and the uppermost surface of the isolation patterns; and
    an word line interconnection formed on the insulating layer pattern and crossing over the high-density first-type ion implantation region.

2. The apparatus of claim 1, wherein the isolation patterns include a trench and an oxide layer filled in a portion of the trench.

3. The apparatus of claim 1, wherein the insulating layer pattern comprises a lower oxide layer formed on the semiconductor substrate, a nitride layer formed on the lower oxide layer and an upper oxide layer formed on the nitride layer.

4. The apparatus of claim 1, wherein the first-type ion comprises at least one of arsenic (As), phosphorus (P) and antimony (Sb).

5. The apparatus of claim 1, wherein the second-type ion comprises at least one of boron (B), boron difluoride ($BF_2$) and indium (In).

6. The apparatus of claim 1, wherein the insulating layer pattern directly contacts a portion of a side surface and a portion of an uppermost surface of the silicon substrate between the isolation patterns.

7. The apparatus of claim 1, wherein the interconnection comprises at least one of doped polysilicon, tantalum nitride (TaN), titanium nitride (TiN), tungsten (W) and tantalum (Ta).

8. The apparatus of claim 1, wherein a portion of the semiconductor substrate between the isolation patterns includes a second-type well formed by implanting a second-type ion into lower portions of the high-density first and second-type ion implantation regions.

9. The apparatus of claim 8, wherein the high-density first-type ion implantation region and the interconnection serve as a bit line and a word line, respectively, in which the bit line receives a voltage in a range between 9V to −10V, the word line receives a voltage in a range between 6V to 8V, and the second-type well receives a voltage identical to the voltage applied to the bit line in a read operation.

10. The apparatus of claim 8, wherein the high-density first-type ion implantation region and the interconnection serve as a bit line and a word line, respectively, in which the bit line receives a voltage in a range between 2V to 3V, the word line receives a voltage in a range between −5V to −8V, and the second-type well receives a voltage of 0V in a read operation.

* * * * *